(12) United States Patent
Frisina et al.

(10) Patent No.: US 7,126,173 B2
(45) Date of Patent: Oct. 24, 2006

(54) METHOD FOR ENHANCING THE ELECTRIC CONNECTION BETWEEN A POWER ELECTRONIC DEVICE AND ITS PACKAGE

(75) Inventors: Ferruccio Frisina, Sant' Agata li Battiati (IT); Antonio Pinto, Catania (IT); Angelo Magri, Belpasso (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 328 days.

(21) Appl. No.: 10/285,363

(22) Filed: Oct. 30, 2002

(65) Prior Publication Data

US 2003/0100154 A1     May 29, 2003

(30) Foreign Application Priority Data

Oct. 30, 2001   (IT)   .......................... MI2001A2284

(51) Int. Cl.
*H01L 29/73* (2006.01)
*H01L 29/76* (2006.01)
*H01L 31/119* (2006.01)
*H01L 29/00* (2006.01)
*H01L 23/495* (2006.01)

(52) U.S. Cl. ...................... 257/287; 257/207; 257/213; 257/288; 257/341; 257/401; 257/500; 257/502; 257/465; 257/673

(58) Field of Classification Search ............... 257/207, 257/213, 287, 288, 341, 401, 465, 500, 502, 257/673
See application file for complete search history.

(56) References Cited

U.S. PATENT DOCUMENTS

| | | | |
|---|---|---|---|
| 4,067,041 A | 1/1978 | Hutson | ........................ 357/80 |
| 4,543,596 A * | 9/1985 | Strack et al. | ................ 257/342 |
| 4,561,168 A | 12/1985 | Pitzer et al. | .................. 29/571 |
| 4,920,064 A * | 4/1990 | Whight | ........................ 438/274 |
| 4,959,705 A * | 9/1990 | Lemnios et al. | ............. 257/532 |
| 5,521,409 A * | 5/1996 | Hshieh et al. | ............... 257/341 |
| 5,597,765 A * | 1/1997 | Yilmaz et al. | .............. 438/270 |
| 5,681,761 A * | 10/1997 | Kim | ........................... 438/151 |
| 5,883,412 A * | 3/1999 | Ferla et al. | .................. 257/341 |
| 6,040,626 A * | 3/2000 | Cheah et al. | ................ 257/735 |
| 6,055,148 A * | 4/2000 | Grover | ........................ 361/103 |
| 6,342,715 B1* | 1/2002 | Shimizu et al. | ............. 257/314 |
| 2003/0001222 A1* | 1/2003 | Street et al. | ................ 257/444 |

FOREIGN PATENT DOCUMENTS

EP         0 720 225 A2      7/1996

\* cited by examiner

*Primary Examiner*—Carl Whitehead, Jr.
*Assistant Examiner*—James Mitchell
(74) *Attorney, Agent, or Firm*—Lisa K. Jorgenson; Robert Iannucci; Seed IP Law Group PLLC

(57) ABSTRACT

An electronic power device of improved structure is fabricated with MOS technology to have a gate finger region and corresponding source regions on either sides of the gate region. This device has a first-level metal layer arranged to independently contact the gate region and source regions, and has a protective passivation layer arranged to cover the gate region. Advantageously, a wettable metal layer, deposited onto the passivation layer and the first-level metal layer, overlies said source regions. In this way, the additional wettable metal layer is made to act as a second-level metal.

33 Claims, 3 Drawing Sheets

METHOD FOR ENHANCING THE ELECTRIC CONNECTION BETWEEN A POWER ELECTRONIC DEVICE AND ITS PACKAGE

BACKGROUND OF THE INVENTION

1. Field of the Invention

The present invention broadly relates to the electric connection of an electronic power device to its package.

In particular, but not limited to, the invention relates to a device which is fabricated with MOS technology to have at least one gate finger region and source regions on either sides of the gate region, the device also having at least one first-level metal layer arranged to independently contact said gate region and said source regions, and a protective passivation layer on top of the gate region.

The invention further relates to an advantageous method of electrically bonding the power device to its package. For convenience of explanation, the description below will make reference to discrete power components.

2. Description of the Related Art

As is well known, factors of prime importance in electronic power devices are minimized resistive contributions (Ron) and enhanced heat dissipation from the device when in its conduction mode.

At present, an assembly technique whereby the bonding wires are replaced with suitably shaped metal strips, or bridging strips, has met both requirements. This technique has proved itself in the instance of bipolar power devices. Also, European Patent No. 0179714 is evidence of a mixed bonding technique, whereby bonding wires are used along with bridging strips as shown in FIG. 1, being known since 1985.

Recently, an effort has been made to extend the mixed bonding technique to small packages, i.e., packages that enclose small-size integrated circuits, where contacting a pad with a clip would use up an unacceptably large amount of area. As an example, with a 7 mm$^2$ device, contacting a gate termination by means of a clip would expend some 0.5 mm$^2$, or 7%, of the active area. On the other hand, if a gate termination were contacted by means of a standard-gage bonding wire, the pad bulk would be brought down five times or less, i.e., to occupy less than 1% of the active area.

For a small-size package, or micro-package, the advantages brought about by the above mixed technique are as tabulated here below:

| Assembly Technique | Resistive Contributions | | |
| --- | --- | --- | --- |
| | Device-to-Package Connection | Distribution of Current across Device Surface | Thermal Resistance to Heat Dissipation |
| Standard | 2 mΩ | 1.5 mΩ | 10° C./W |
| Bridge | 0.5 mΩ | 0.1 mΩ | 7° C./W |
| Gain | 1.5 mΩ(75%) | 1.4 mΩ(93%) | 3° C./W (30%) |

However, this mixed bonding technique is subject to certain constraints when used with MOS devices, due to the presence of considerable fingered gate and source metal lines on the device front.

Bonding fingered structures by means of bridges currently involves breaking the wettable metal line short of the gate fingers, e.g., as shown schematically in FIG. 2.

FIG. 2 is reproduced from U.S. Pat. No. 6,040,626, which is incorporated by reference herein in its entirety, to show a vertical cross-section taken through a gate finger. The following layers are recognizable: gate metal (19a), source metal (18), passivation (27), wettable metal (25), conductive adhesive (46), and bridge (30) layers. The lack of wettable metal in the gate finger structure results, especially in structures that are considerable fingered, in a substantial loss of contact area that reflects significantly on the device output resistance (Ron).

In view of most of the applications on demand today favoring devices with a very low Ron and high speed for high frequency operation, avoidance of conflicting fingered structure requirements and resistive contributions is of primary concern.

BRIEF SUMMARY OF THE INVENTION

An embodiment of the present invention utilizes a wettable metal line as if it were just a second metal level, and utilizes the first metal level both as a gate metal and a contact layer between the second metal level and the device source.

In this way, the two metal layers would be separated by a final passivation layer. In addition, breaking the wettable metal line short of the gate fingers would no longer be necessary.

An embodiment of the invention is directed to a method of fabricating an electronic power device of improved design with MOS technology, which device comprises at least one region of gate fingers and associated source regions on either sides of the gate region, and comprises at least one first-level metal layer, arranged to independently contact said gate region and said source regions, and a protective passivation layer over the gate region, the method including the steps of:

forming said first metal level over the source regions and the gate fingers;

forming a passivation layer over the gate fingers to partly overlap the first source metal level; and forming a wettable metal layer, on top of the passivation layer and the first-level metal layer, to extend over said source regions.

An embodiment of the invention further relates to a device as previously indicated and including a wettable metal layer, deposited onto the passivation layer and the first-level metal layer, to extend over said source regions.

The features and advantages of the invention should become understood from the description of embodiments thereof, given by way of example and not of limitation with reference to the accompanying drawings.

DETAILED DESCRIPTION OF THE INVENTION

Figure 1:
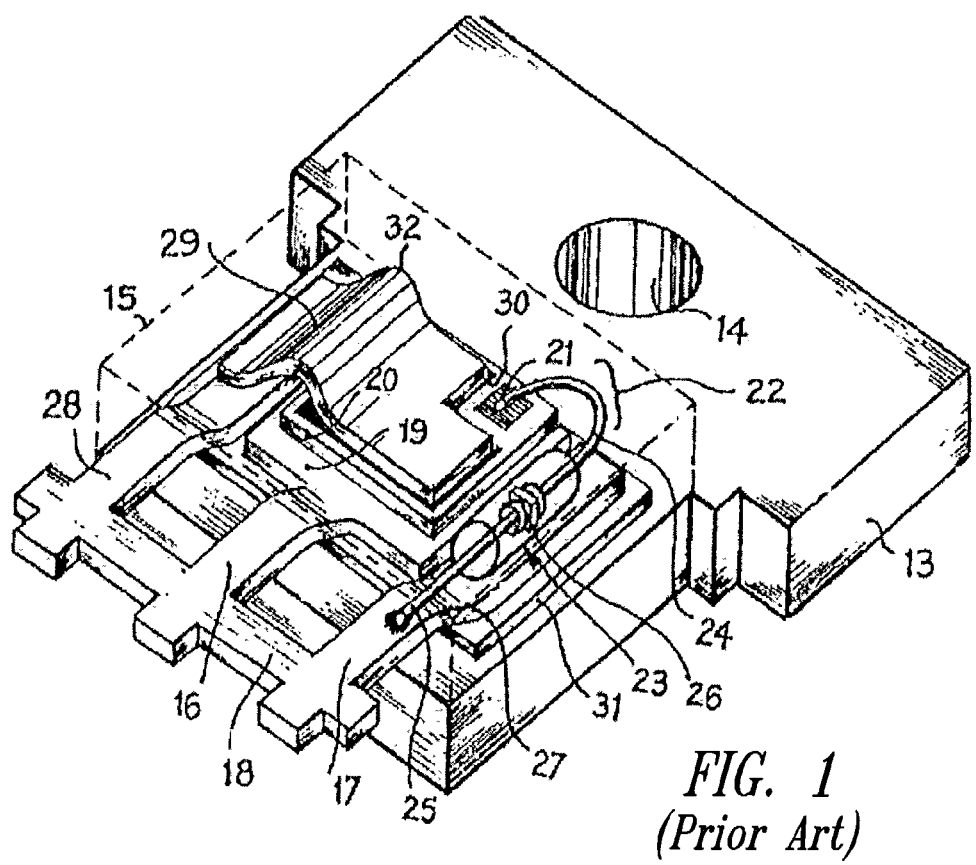
FIG. 1 is a schematic perspective view of an electronic power device where a mixed bonding technique has been used for its interconnection.
Figure 2:
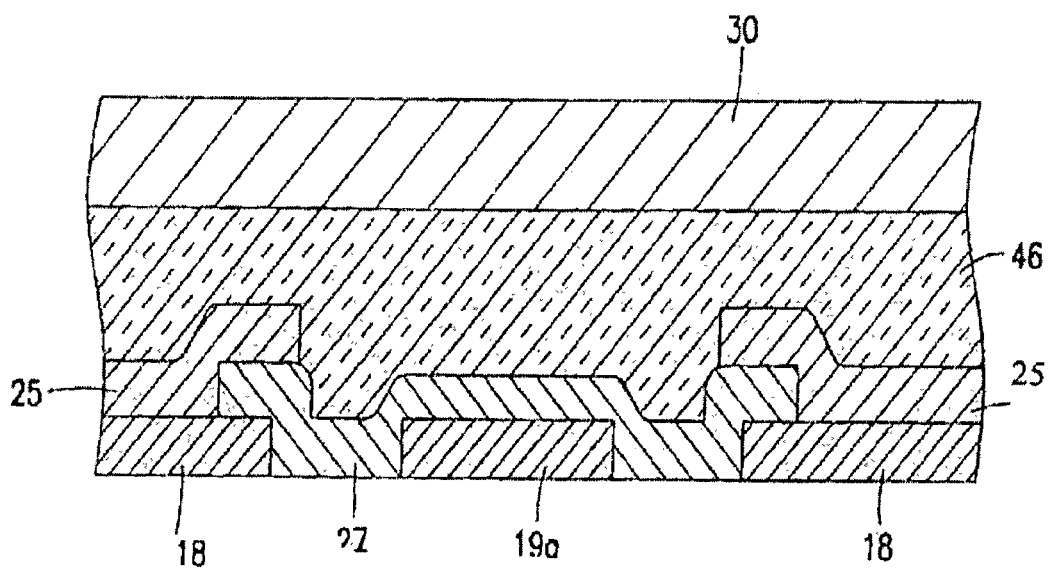
FIG. 2 is a schematic enlarged-scale view in vertical cross-section of an electronic power device having a so-called interconnection gate finger.

The applicants have discovered that, areas of the prior art device of FIG. 2 without wettable metal lines that extend beneath the bridge bonding are areas of doubtful adhesion into which solvents from the soft solder may flow. The structure and chemical composition of the adhesive in such areas can be quite different from that in the areas overlying the wettable metal.

Figure 3:
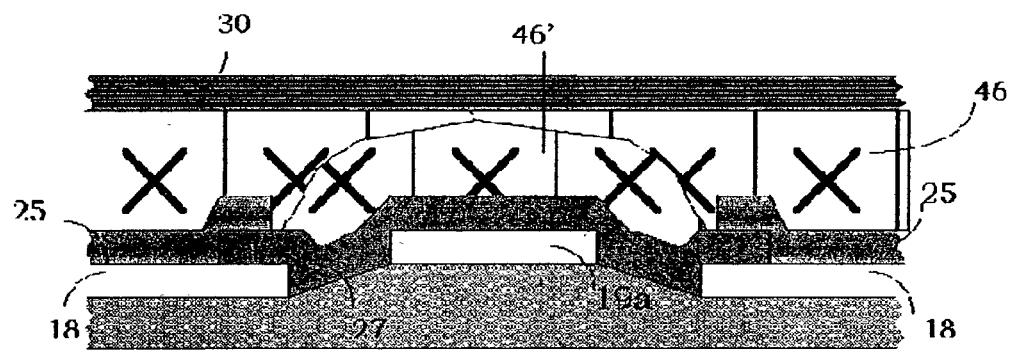
FIG. 3 is a schematic enlarged-scale view in vertical cross-section of an electronic power device of conventional design.

FIG. 3 schematically illustrates the formation of precipitates from said solvents in the area immediately above the passivation layer 27 overlying the gate metal 19a. The photograph in FIG. 4 shows the cross-section of a prototype formed in conformity with the prior art rules.

Figure 4:
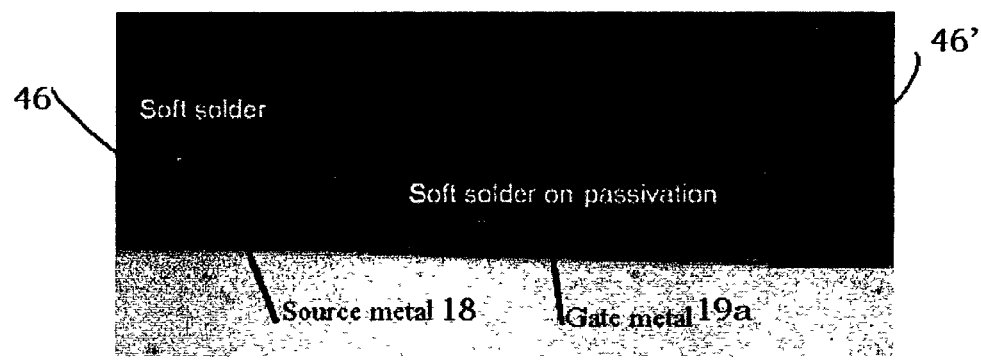
FIG. 4 is a photograph of a vertical cross-section taken through the power device of FIG. 3 at the gate finger thereof.

As shown in FIGS. 3–4, the adhesive is a two-part soft solder layer 46, 46' provided on top of the passivation layer 27 and also on the wettable metal layers 25. However, the solder 46' over the wettable metal layers 25 has different granulation from the solder 46 that directly covers the passivation layer 27.

The presence of areas having different chemical compositions may damage the reliability of a product by thermal stressing, especially if fabricated in a wet environment. Thus, the above-described prior technique, related to the bridge bounding when metallization layers are not formed on the finger gate, has at least two major disadvantages:

1) a loss of contact area, which may grow to significance in the instance of considerable fingered devices; and 2) areas of uncontrolled chemical composition, which may damage reliability.

An embodiment of this invention provides a method of improving the electric bonding of an electronic power device to its package such that the aforementioned two disadvantages are attenuated and/or obviated.

Figure 5:
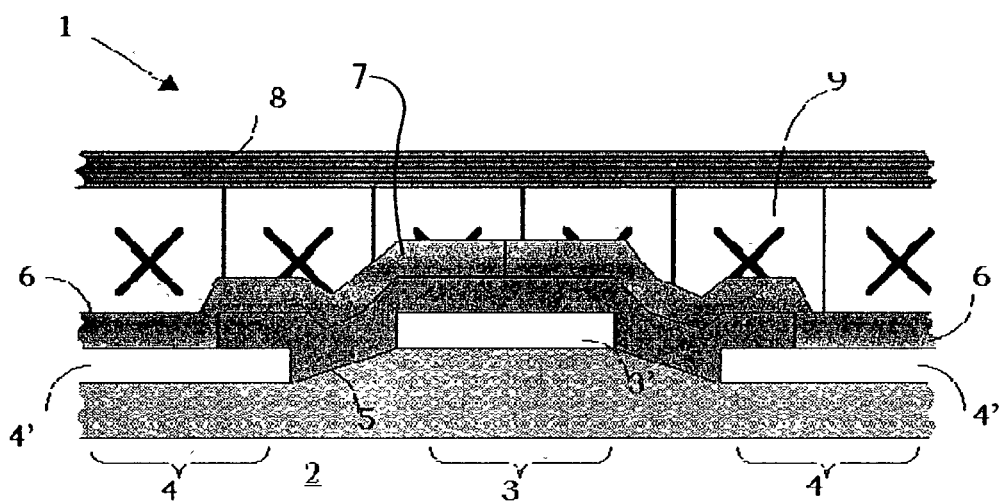
FIG. 5 is a schematic enlarged-scale view in vertical cross-section of an electronic power device formed according to the invention.

With reference to the drawings, in particular to the embodiment shown in FIG. 5, generally shown in schematic form at 1 is an electronic power device whose interconnections have been established in accordance with the inventive method.

The device 1 is fabricated on a substrate 2 of a semiconductor material to a layout known per se. In other words, the device 1 may be a power device fabricated with MOS technology, which has a gate middle region 3 and respective source regions 4 on either sides of the gate region 3. The drain regions are not shown in FIG. 5, but are positioned on an opposite side of the substrate 2 with respect to the source regions 4.

The device 1 is a discrete device, and has its gate region 3 formed as a so-called gate "finger", that is an elongate flat layer whose length dimension exceeds its cross dimension.

Each region 3, 4 is contacted by a respective metal that can be regarded as a first-level metal. Thus, a gate metal 3' and respective source metals 4' are provided.

As shown best in FIG. 5, a passivation layer 5 separates metal layer 3' from metal layers 4'.

Provided on top of each first-level metal layer 3', 4' is a covering layer that includes a metal layer 6, 7 which will be wettable in the course of subsequent process steps ending in the finished electronic device.

The wettable metal layer 6, 7 is formed over the first-level metal layers 3' and 4', and on the passivation layer 5, to be substantially flush with the latter.

A soft solder 9 is provided on top of the wettable metal layer 6, 7 which covers both the source metal layers 4' and the passivation layer 5. As a result, the solder 46 over the source metal layers 4' has the same granulation as the solder 46 that is over the passivation layer 5 and gate metal layer 3'.

The structure of the device is completed with a thin bridge interconnection layer 8 that extends over the solder layer 9.

Unlike the prior art, the device 1 includes a wettable metal layer 7 that advantageously extends over the passivation layer 5 in continuation of the metal layers 6 that are covering the first-level metals 4'. This layer 7 covers the passivating layer 5 completely.

In this way, the wettable metal layer 6, 7 is not broken short of the gate fingers, with the benefit of eliminating a non-wettable area that gave way to the formation of precipitates in the prior art.

Summarized here below are the process steps that form the discrete type of electronic power device 1 having at least two metal levels and a wettable final surface. As an example, the following process steps could be provided:

a first metal layer, e.g., formed by an aluminum layer 1 to 5 μm thick, suitably doped with impurities such as silicon and/or copper impurities;

a passivation layer 0.5 to 1 μm thick of deposited oxide;

a second, wettable metal layer, e.g., formed by a triple layer comprising a stack structure of titanium (~1000 A), nickel (~3000 A), and gold (~500 A) in a stack configuration.

It should be understood that the layers mentioned above are for exemplification only, it being possible for them to be substituted with any other layers known in the semiconductor industry that exhibit the features specified here below.

For the first metal level: one or more conductive layers that are compatible for the subsequent steps of forming the passivation layer and second metal level; they are to ensure good contact to the source and gate regions 4 and 3 of device 1.

For the passivation layer: one or more insulating layers that are compatible for the step of forming the second metal level; the faultiness, integrity and dielectric rigidity of the layers should all be adequate to provide good electrical isolation of the two levels of metal from each other.

For the second metal level: one or more conductive layers effective to ensure good contact to the first metal layer and provide a solder-wettable surface for use with bridging strips in the mixed bonding method.

The device 1 uses the wettable metal as a real second metal level, and using the first level as a gate metal and contact layer between the second metal level and the source of the device. The two metal layers are separated by the final passivation layer. In this way, the wettable metal is not broken short of the gate fingers, as illustrated schematically by FIG. 5.

From a comparison of the embodiment of FIG. 5 with the prior art of FIG. 3, it is evinced that the region overlying the passivation layer of the gate region 3 has now been covered with a wettable metal layer. Accordingly, the area of the gate finger is utilized as a contact area of contact, with the benefit of eliminating the non-wettable area where precipitates had a chance of forming. Furthermore, the double metal levels 3', 7 provided have the advantage of ensuring a uniform distribution of the current flow even when a number of gate fingers are present, which is highly advantageous from both the rigidity and reliability standpoints.

This first embodiment of the invention is also uniquely effective in those cases where the final bridge layer 8 is replaced with an IC chip that has to be electrical connected to one or more electrodes of the device underneath. This structure is known in the industry as of "chip-on-chip" and is usually obtained through the use of a conductive adhesive.

Figure 6:
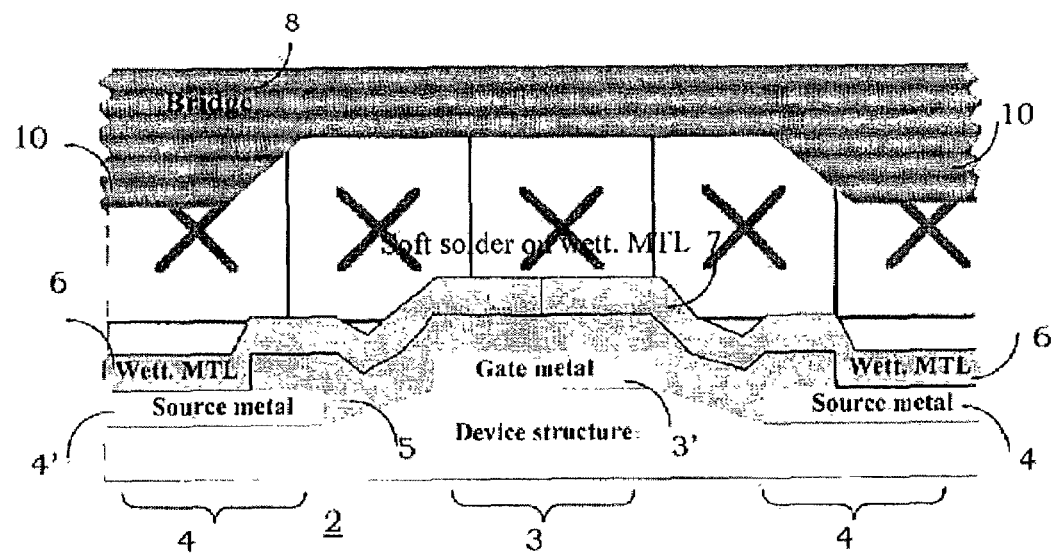
FIG. 6 is a schematic enlarged-scale view in vertical cross-section of a second embodiment of the electronic power device according to this invention.

A second embodiment of this invention will now be described with reference to FIG. 6, where co-operating parts structurally and functionally similar to those of the first embodiment shown in FIG. 5 are denoted by the same reference numerals.

In the second embodiment of this invention, the bridge layer 8 is shaped aligned with the gate fingers to prevent excess pressure on the device layers from causing the passivation layer 5 to crack and create undesired short-circuits across the first 3', 4' and second 7 metal levels, notably in those areas where the soft solder is laid quite thinly.

Briefly, the solder layer 9 is shaped in the source regions 4, laterally of the gate fingers, to enable the bridge layer 8 to reach deeply enough to form sorts of side support legs or feet 10.

The shaping depth is dependent on the device own inequalities (1 to 4 μm), its width being dependent on the gate finger widths and the position tolerance for the bridge layer 8 on the device 1 (50 to 300 μm).

Of course, this technique can be applied regardless of whether the wettable metal layer 7 is provided on the gate finger.

However, the greatest benefit in reliability is to be secured by combining both techniques together, because:

the wettable metal layer 7 on the gate fingers inhibits the formation of undesired compounds; and the shaped bridge layer 8 with side legs or feet 10 resists excess pressure on the structure near the gate fingers.

Figure 7:
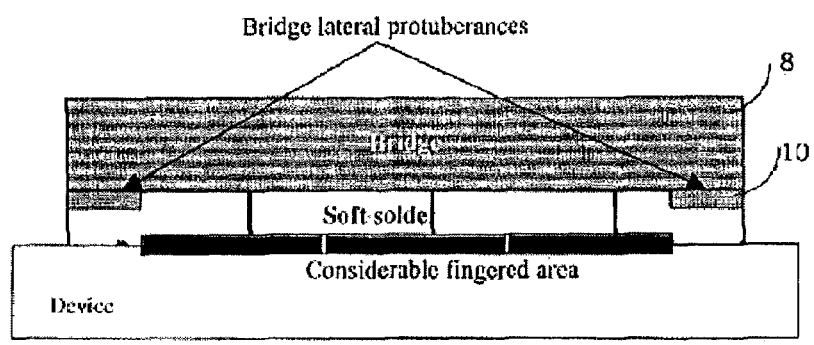
FIG. 7 is a schematic enlarged-scale view in vertical cross-section of an electronic power device whose structure includes a plurality of gate fingers.

For power devices that have considerable fingered areas, the shape of the bridge layer 8 may be an extended one to overlap all the area where the gate finger plurality are present. In this way, the mechanical structure of the bridge layer 8 is made simpler. Briefly, instead of forming supporting feet 10 on either sides of each gate finger, as shown in FIG. 6, much broader (500 to 2000 μm) bridge layers are provided to cover a plurality of gate fingers, as shown schematically in FIG. 7. The example of FIG. 7 may be regarded as an extreme case where the layer 8 covers the whole device 1. Thanks to the supporting feet 20, the mechanical pressure is confined to within the side areas where no fingered structure occurs.

The device 1 and method described above afford a number of advantages by providing for the introduction of a real second metal level in discrete power devices and, where appropriate, for the bridge layer to be suitably shaped.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An electronic power device fabricated with MOS technology, the power device comprising:
    a gate finger region;
    associated first and second source regions positioned at opposite sides of the gate finger region;
    a first-level metal layer having a first metal portion contacting said gate finger region, a second metal portion contacting said first source region, and a third metal portion contacting said second source region;
    a dielectric passivation layer arranged to cover the gate finger region; and
    a wettable metal layer formed directly on a portion of the passivation layer directly above the gate finger region and the second and third metal portions of the first-level metal layer, wherein the wettable metal layer contacts and extends continuously between the second and third metal portions of the first-level metal layer.

2. A device according to claim 1, wherein said wettable metal layer provides a second-level metal layer.

3. A device according to claim 1, wherein said wettable metal layer is coated with a solder layer covered by a thin bridge layer.

4. A device according to claim 3, wherein said thin bridge layer is shaped to have supporting feet-shaped side projections arranged to reach down to said source regions.

5. A device according to claim 3, wherein the gate finger region is one of a plurality of gate finger regions occupying a whole area and said thin bridge layer is extended to overlap the whole area occupied by the plurality of gate finger regions, and has peripheral supporting projections arranged to reach down to said source regions on opposite sides of the gate finger regions.

6. A device according to claim 1, wherein said wettable metal layer is a triple layer comprising a stack structure of titanium, nickel and gold.

7. A device according to claim 1, wherein said wettable metal layer is coated with a solder layer covered by an integrated circuit chip to provide a chip-on-chip structure.

8. An electronic power device, comprising:
    a gate region;
    associated source regions positioned at opposite sides of the gate region;
    a protective passivation layer arranged to cover the gate region;
    an adhesive layer positioned above the passivation layer;
    prevention means for preventing chemical reaction of the adhesive layer and the passivation layer;
    a thin bridge layer covering the adhesive layer, wherein the thin bridge layer is shaped to have supporting feet-shaped side projections positioned laterally of a central portion of the adhesive layer.

9. The device of claim 8 wherein the source regions and the gate region are covered by respective metal contacts and the passivation layer extends between the metal contact of the gate region and the respective metal contacts of the source regions.

10. The device of claim 9 wherein the passivation layer is a dielectric layer and the prevention means include a wettable metal layer positioned directly above the gate region and between the passivation layer and the adhesive layer.

11. A device according to claim 10, wherein the metal contacts of the gate and source regions are part of a first-level metal layer and the wettable metal layer is part of a second-level metal layer.

12. The device of claim 8 wherein the prevention means include a wettable metal layer positioned above the gate region and between the passivation layer and the adhesive layer.

13. The device of claim 12, wherein the wettable metal layer includes a triple layer stack structure of titanium, nickel, and gold.

14. An electronic power device, comprising:
a gate region;
associated source regions positioned at opposite sides of the gate region;
a protective passivation layer arranged to cover the gate region;
an adhesive layer positioned above the passivation layer;
prevention means for preventing chemical reaction of the adhesive layer and the passivation layer; and
a thin bridge layer covering the adhesive layer, wherein the gate region is one of a plurality of gate regions occupying a whole area and the thin bridge layer is extended to overlap the whole area occupied by the plurality of gate regions, and has peripheral supporting projections positioned laterally of a central portion of the adhesive layer.

15. The device of claim 14 wherein the prevention means include a wettable metal layer positioned above the gate region and between the passivation layer and the adhesive layer.

16. An electronic power device, comprising:
a gate finger region;
corresponding source regions on opposite sides of the gate finger region;
a first-level metal layer formed over, and independently contacting, the gate finger region and the source regions; and
a dielectric passivation layer covering the gate finger region and partly overlapping the first-level metal layer; and
a wettable metal layer positioned directly on top of the passivation layer and directly above the gate finger region and the source regions, wherein the wettable metal layer contacts and extends continuously between portions of the first-level metal layer that contact the source regions.

17. The device of claim 16, wherein said wettable metal layer is covered with a solder layer, in turn covered with a thin bridge layer.

18. The device of claim 16, wherein the wettable metal layer is a triple layer comprising a stack structure of titanium, nickel and gold.

19. The device of claim 16, further comprising:
a solder layer covering the wettable metal layer and formed with two reduced regions on opposite sides of the gate finger region; and
a thin bridge layer on the solder layer such that supporting feet-shaped side projections from said bridge layer fit in said reduced regions.

20. The device of claim 16, further comprising:
a solder layer covering the wettable metal layer; and
a thin bridge layer on the solder layer, wherein the gate finger region is one of a plurality of gate finger regions occupying a whole area and said thin bridge layer is extended to overlap the whole area occupied by the plurality of gate finger regions, and has peripheral supporting projections arranged to reach down to said source regions on opposite sides of the gate finger regions.

21. The device of claim 16, wherein said wettable metal layer is coated with a solder layer covered by an integrated circuit chip to provide a chip-on-chip structure.

22. An electronic power device fabricated with MOS technology, the power device comprising:
a gate finger region;
associated source regions positioned at opposite sides of the gate finger region;
a first-level metal layer arranged to independently contact said gate finger region and said source regions;
a protective passivation layer arranged to cover the gate finger region; and
a wettable metal layer deposited onto the passivation layer and the first-level metal layer overlying said source regions, wherein said wettable metal layer is a triple layer comprising a stack structure of titanium, nickel and gold, wherein said wettable metal layer is coated with a solder layer covered by a thin bridge layer, wherein said thin bridge layer is shaped to have supporting feet-shaped side projections arranged to reach down to portions of said first-level metal layer overlying said source regions.

23. The device of claim 22 wherein the wettable metal layer contacts portions of the first-level metal layer that contact the source regions.

24. An electronic power device fabricated with MOS technology, the power device comprising:
a gate finger region;
associated source regions positioned at opposite sides of the gate finger region;
a first-level metal layer arranged to independently contact said gate finger region and said source regions;
a protective passivation layer arranged to cover the gate finger region; and
a wettable metal layer deposited onto the passivation layer and the first-level metal layer overlying said source regions, wherein said wettable metal layer is a triple layer comprising a stack structure of titanium, nickel and gold, wherein said wettable metal layer is coated with a solder layer covered by a thin bridge layer, wherein the gate finger region is one of a plurality of gate finger regions occupying a whole area and said thin bridge layer is extended to overlap the whole area occupied by the plurality of gate finger regions, and has peripheral supporting projections arranged to reach down to portions of said first-level metal layer overlying said source regions on opposite sides of the gate finger regions.

25. The device of claim 24 wherein the wettable metal layer contacts portions of the first-level metal layer that contact the source regions.

26. An electronic power device fabricated with MOS technology, the power device comprising:
a gate finger region;
associated first and second source regions positioned at opposite sides of the gate finger region;
a first-level metal layer having a first metal portion contacting said gate finger region, a second metal portion contacting said first source region, and a third metal portion contacting said second source region;
a dielectric passivation layer arranged to cover the gate finger region; and
a wettable metal layer formed directly on a portion of the passivation layer directly above the gate finger region and the second and third metal portions of the first-level metal layer, wherein said wettable metal layer is coated with a solder layer covered by a thin bridge layer, wherein said thin bridge layer is shaped to have supporting feet-shaped side projections arranged to reach down to said source regions.

27. The device of claim 26 wherein the supporting feet-shaped side projections are respectively positioned laterally of a central portion of the solder layer.

28. An electronic power device fabricated with MOS technology, the power device comprising:
a gate finger region;
associated first and second source regions positioned at opposite sides of the gate finger region;
a first-level metal layer having a first metal portion contacting said gate finger region, a second metal portion contacting said first source region, and a third metal portion contacting said second source region;
a dielectric passivation layer arranged to cover the gate finger region; and
a wettable metal layer formed directly on a portion of the passivation layer directly above the gate finger region and the second and third metal portions of the first-level metal layer, wherein said wettable metal layer is coated with a solder layer covered by a thin bridge layer, wherein the gate finger region is one of a plurality of gate finger regions occupying a whole area and said thin bridge layer is extended to overlap the whole area occupied by the plurality of gate finger regions, and has peripheral supporting projections arranged to reach down to said source regions on opposite sides of the gate finger regions.

29. The device of claim 28 wherein the supporting feet-shaped side projections are respectively positioned laterally of a central portion of the solder layer.

30. An electronic power device, comprising:
a gate finger region;
corresponding source regions on opposite sides of the gate finger region;
a first-level metal layer formed over, and independently contacting, the gate finger region and the source regions; and
a dielectric passivation layer covering the gate finger region and partly overlapping the first-level metal layer;
a wettable metal layer positioned directly on top of the passivation layer and directly above the gate finger region and the source regions;
a solder layer covering the wettable metal layer and formed with two reduced regions on opposite sides of the gate finger region; and
a thin bridge layer on the solder layer such that supporting feet-shaped side projections from said bridge layer fit in said reduced regions.

31. The device of claim 30 wherein the wettable metal layer contacts portions of the first-level metal layer that contact the source regions.

32. An electronic power device, comprising:
a gate finger region;
corresponding source regions on opposite sides of the gate finger region;
a first-level metal layer formed over, and independently contacting, the gate finger region and the source regions; and
a dielectric passivation layer covering the gate finger region and partly overlapping the first-level metal layer;
a wettable metal layer positioned directly on top of the passivation layer and directly above the gate finger region and the source regions;
a solder layer covering the wettable metal layer; and
a thin bridge layer on the solder layer, wherein the gate finger region is one of a plurality of gate finger regions occupying a whole area and said thin bridge layer is extended to overlap the whole area occupied by the plurality of gate finger regions, and has peripheral supporting projections arranged to reach down to said source regions on opposite sides of the gate finger regions.

33. The device of claim 32 wherein the wettable metal layer contacts portions of the first-level metal layer that contact the source regions.

* * * * *